(12) United States Patent
Jiang

(10) Patent No.: US 10,578,668 B2
(45) Date of Patent: Mar. 3, 2020

(54) DETECTION DEVICE FOR MOBILE PHONE CAMERA MODULE

(71) Applicant: DOTHINKEY (HONGKONG) TECHNOLOGY CO., LIMITED, Hong Kong (CN)

(72) Inventor: Siyuan Jiang, Guangdong (CN)

(73) Assignee: DOTHINKEY (HONGKONG) TECHNOLOGY CO., LIMITED, Hong Kong (CN)

( * ) Notice: Subject to any disclaimer, the term of this patent is extended or adjusted under 35 U.S.C. 154(b) by 160 days.

(21) Appl. No.: 15/751,476

(22) PCT Filed: Aug. 22, 2017

(86) PCT No.: PCT/CN2017/098467
§ 371 (c)(1),
(2) Date: Feb. 9, 2018

(87) PCT Pub. No.: WO2018/040980
PCT Pub. Date: Mar. 8, 2018

(65) Prior Publication Data
US 2019/0331728 A1   Oct. 31, 2019

(30) Foreign Application Priority Data

Aug. 31, 2016   (CN) ..................... 2016 2 1024858 U

(51) Int. Cl.
*G01R 31/28*   (2006.01)
*H05K 1/18*   (2006.01)

(52) U.S. Cl.
CPC ....... *G01R 31/286* (2013.01); *G01R 31/2886* (2013.01); *H05K 1/181* (2013.01); *H05K 2201/10734* (2013.01)

(58) Field of Classification Search
CPC .. G01R 31/286; G01R 31/2886; H05K 1/181; H05K 2201/10734
See application file for complete search history.

(56) References Cited

U.S. PATENT DOCUMENTS

| | | | | |
|---|---|---|---|---|
| 4,769,711 A | * | 9/1988 | Date | H04N 5/2254 348/335 |
| 7,146,179 B2 | * | 12/2006 | Parulski | H04M 1/72561 455/456.3 |
| 9,798,314 B2 | * | 10/2017 | Dougherty | G05B 19/402 |
| 2002/0173070 A1 | * | 11/2002 | Bolken | H01L 21/565 438/106 |

(Continued)

*Primary Examiner* — Dominic E Hawkins

(57) ABSTRACT

A detection device for a mobile phone camera module includes a casing, a power board, a main board, a camera module data interface unit, and a connection port unit, wherein both the power board and the main board are disposed within the casing; the power board is respectively electrically connected with the camera module data interface unit and the connection port unit; the casing has multiple windows for respectively accommodating the camera module data interface unit and the connection port unit; a radiator, a power switch and an indicator light are disposed within the casing, and are electrically connected with both the main board and the power board. Furthermore, the detection device provided by the present invention provides multiple connection ports.

1 Claim, 2 Drawing Sheets

(56) References Cited

U.S. PATENT DOCUMENTS

| | | | |
|---|---|---|---|
| 2004/0222944 A1* | 11/2004 | Sivertsen | H04L 67/025 345/1.1 |
| 2005/0020239 A1* | 1/2005 | Kang | H04N 5/2252 455/403 |
| 2006/0055786 A1* | 3/2006 | Ollila | H04N 5/2251 348/207.99 |
| 2014/0340680 A1* | 11/2014 | Montminy | H04N 17/002 356/326 |

* cited by examiner

DETECTION DEVICE FOR MOBILE PHONE CAMERA MODULE

CROSS REFERENCE OF RELATED APPLICATION

This is a U.S. National Stage under 35 U.S.C. 371 of the International Application PCT/CN2017/098467, filed Aug. 22, 2017, which claims priority under 35 U.S.C. 119(a-d) to CN 201621024858.2, filed Aug. 31, 2016.

BACKGROUND OF THE PRESENT INVENTION

Field of Invention

The present invention relates to a technical field of mobile phone camera modules, and more particularly to a detection device for a mobile phone camera module.

Description of Related Arts

In recent years, with the development of science and technology, all kinds of semiconductor chip products have been replaced to varying degrees, and especially the image sensor has higher and higher requirements for automation, the volume of the image testing equipment and the image transmission while being produced by camera module manufacturers, and the current and open short circuit test accuracy also requires more demanding.

The current detection device for the mobile phone camera module needs to be installed on the testing equipment, so as to complete the testing at high speed. When the existing detection device for the mobile phone camera module is installed on the testing equipment, there is a difficulty in the installation because there is no fixed way such as a screw hole. More importantly, there are still difficulties in simultaneous acquiring and analyzing images with dual cameras.

SUMMARY OF THE PRESENT INVENTION

A technical problem to be solved of the present invention is how to provide a detection device for a mobile phone camera module, which is able to easy to be installed to the test equipment for detecting the camera module and has rich functions.

Technical solutions of the present invention to solve the above technical problem are as follows.

A detection device for a mobile phone camera module comprises a casing, a power board, a main board, a camera module data interface unit, and a connection port unit, wherein both the power board and the main board are disposed within the casing; the power board is respectively electrically connected with the camera module data interface unit and the connection port unit; the casing has multiple windows for respectively accommodating the camera module data interface unit and the connection port unit; a radiator, a power switch and an indicator light are disposed within the casing, and are electrically connected with both the main board and the power board.

Compared with the prior art, beneficially effects of the present invention are as follows. The detection device provided by the present invention is able to be easily fixed to the external test equipment, the power board is connected with the camera module data interface unit and the connection port unit, so that when the mobile phone camera module is tested, other functions are able to be simultaneously achieved through other ports.

On the basis of the above technical solution, the present invention is able to also be improved as follows.

Further, the casing is a cuboid and comprises a front cover, a lower cover, an upper cover and a rear cover; the lower cover, the upper cover and the rear cover are in fitted assembly with each other to form a chamber having an opening, the front cover is in fitted assembly with the chamber at the opening thereof; the front cover has multiple windows for respectively accommodating the connection port unit and the radiator; the upper cover has multiple windows for respectively accommodating the camera module data interface unit, the power switch and the indicator light.

Beneficially effects of the above technical solution are as follows. The casing comprises the upper cover, the lower cover, the front cover and the rear cover which facilitates setting various connection ports; the various connection ports are uniformly set on the front cover which facilitating installation, management and usage; the upper cover has windows for accommodating the camera module data interface unit which not only facilitates management and usage, but also can effectively reduce the volume of the detection device.

Further, the connection port unit comprises an expansion port, a power port and a USB 3.0 port.

Beneficially effects of the above technical solution are as follows. Different connection ports are able to achieve different functions, so as to make the function of the detection device for the mobile phone camera module more comprehensively.

Further, the detection device for the mobile phone camera module further comprises an adapter plate, wherein the adapter plate is fixed to the power board through copper columns, all of the power port, the USB3.0 port, the indicator light and the power switch are welded to the adapter plate.

Beneficially effects of the above technical solution are as follows. The adapter plate plays the role in supporting the power port, the USB 3.0 port, the indicator light and the power switch to be more reliably fixed.

Further, the camera module data interface unit has two ports and comprises two female headers, each of which has 40 pins.

Beneficially effects of the above technical solution are as follows. The camera module data interface unit has two ports and comprises two female headers, each of which has 40 pins, so that the data transmission speed reaches 1.5 Gbps, five sets of sensor programmable power supplies with high precision and low noise are also provided, and the sensor current detection technology and the sensor open short circuit detection are supported.

Further, an FBGA (Fine-Pitch Ball Grid Array) chip and an FX3 chip are disposed on the main board.

Beneficially effects of the above technical solution are as follows. The FBGA chip and the FX3 chip are set on the main board, so as to support the five-channel sensor programmable power supplies with high precision and low noise and support the I2C communication speed of 1 MHz.

Figure 1:
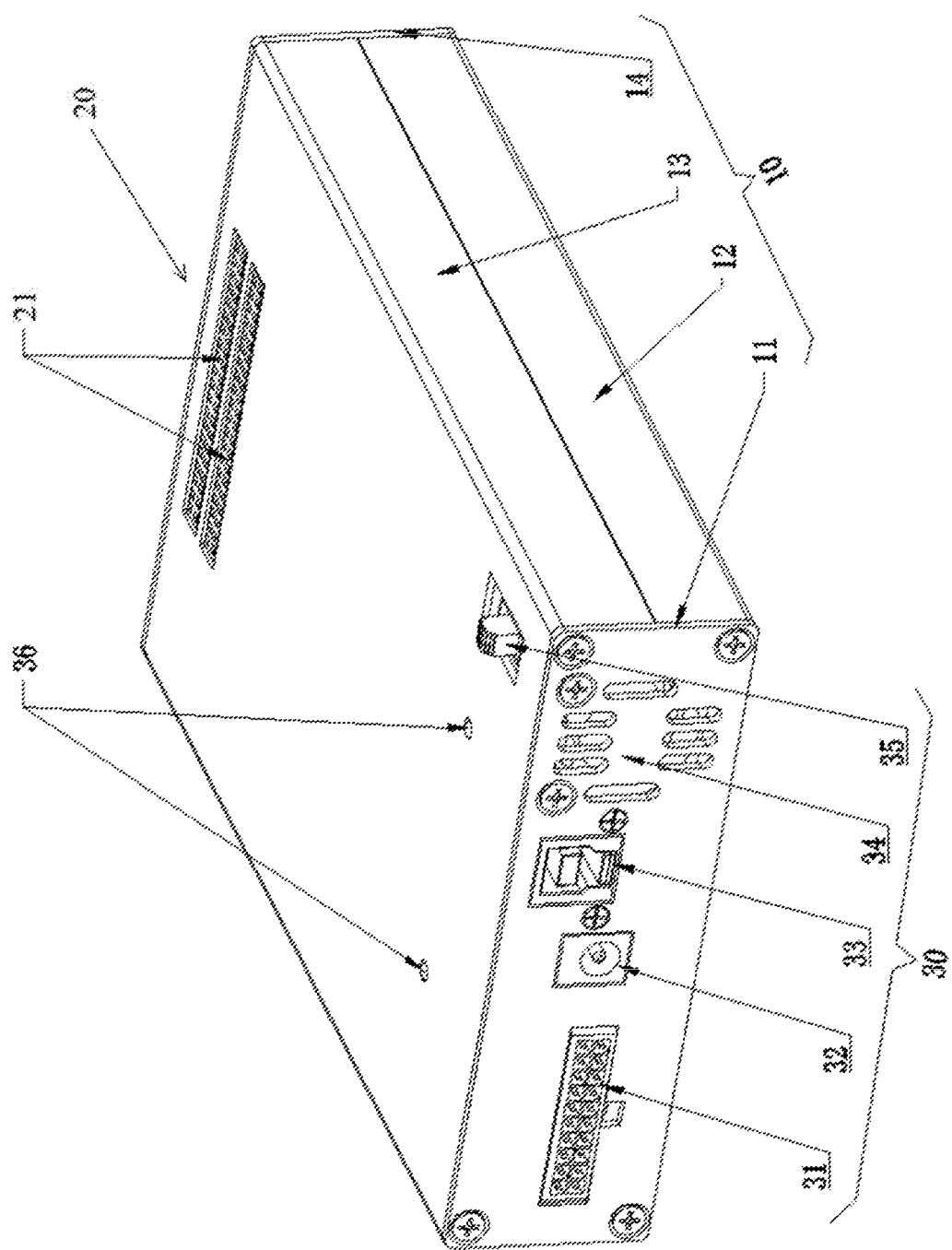
FIG. 1 is a structurally schematic view of a detection device for a mobile phone camera module according to a preferred embodiment of the present invention.

In the drawings, elements represented by labels are listed as below:

10: casing; 11: front cover; 12: lower cover; 13: upper cover; 14: rear cover; 20: camera module data interface unit; 21: female header; 30: connection port unit; 31: expansion port; 32: power port; 33: USB3.0 port; 34: radiator; 35: power switch; 36: indicator light; 40: power board; 50: main board; 51: FBGA (Fine-Pitch Ball Grid Array) chip; 52: FX3 chip; 60: OS (Oriented Strand) board; 70: adapter plate.

DETAILED DESCRIPTION OF THE PREFERRED EMBODIMENT

The principle and features of the present invention are described below with reference to accompanying drawings. The illustrated examples are only used to explain the present invention, and are not intended to limit the scope of the present invention.

Figure 2:
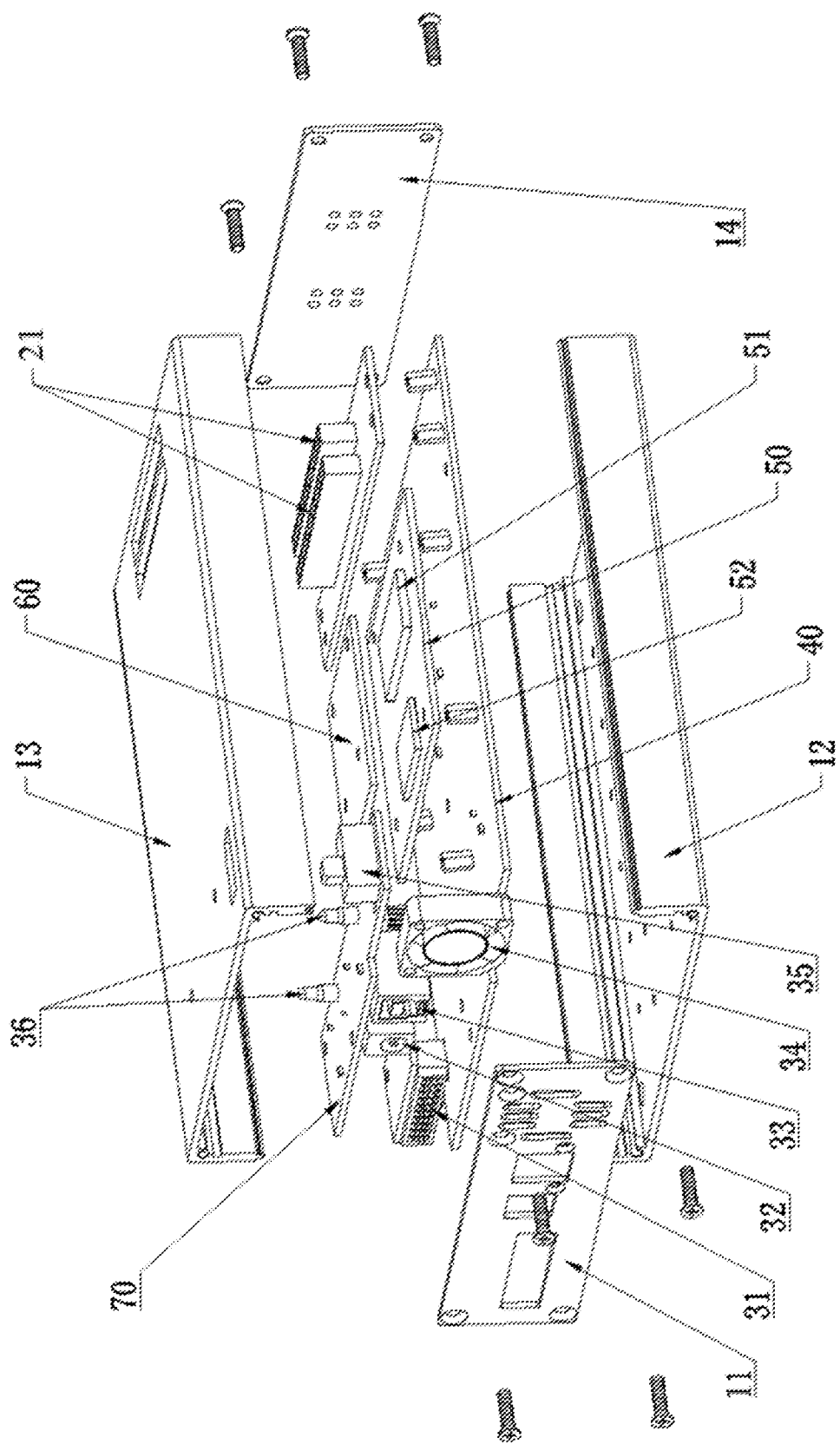
FIG. 2 is an explosive view of the detection device for the mobile phone camera module according to the above preferred embodiment of the present invention.

As shown in FIGS. 1 and 2, a detection device for a mobile phone camera module is illustrated, which comprises a casing 10, a camera module data interface unit 20, a connection port unit 30, a power board 40, a main board 50, an OS (Oriented Strand) board 60 and an adapter plate 70, wherein both the power board 40 and the main board 50 are disposed within the casing 10; all of the main board 50, the OS board 60 and the adapter plate 70 are fixed to the power board 40 through copper columns; the power board 40 is respectively connected with the camera module data interface unit 20 and the connection port unit 30; the casing 10 has multiple windows for accommodating the camera module data interface unit 20 and the connection port unit 30. The detection device further comprises a radiator 34, a power switch 35 and an indicator light 36, wherein all of the radiator 34, the power switch 35 and the indicator light 36 are electrically connected with both the main board 50 and the power board 40.

According to a preferred embodiment of the present invention, the casing 10 is adapted for protecting various components on the power board 40 and the main board 50. Both an FBGA (Fine-Pitch Ball Grid Array) chip 51 and an FX3 chip 52 are set on the main board 50 for achieving that a data transmission speed reaches 1.5 Gbps. The camera module data interface unit 20 comprises two female headers 21 for respectively defining two interfaces of the camera module data interface unit 20, and is able to support the testing of double camera modules, wherein each of the two female headers 21 has 40 pins. The present invention provides five sets of sensor programmable power supplies with high precision and low noise, and is able to support the sensor current detection technology and the sensor open short circuit detection. The two female headers 21 with the 40 pins are connected with the power board 40 through pin headers. The connection port unit 30 comprises an expansion port 31, a power port 32 and a USB (universal serial bus) 3.0 port 33, wherein the expansion port 31 is an aviation port, a receptacle of the expansion port 31 is welded to the power board 40; all of the power port 32, the USB 3.0 port 33, the power switch 35 and the indicator light 36 are welded to the adapter plate 70.

According to the preferred embodiment of the present invention, the casing 10 is a cuboid and comprises a front cover 11, a lower cover 12, an upper cover 13 and a rear cover 14, wherein the lower cover 12, the upper cover 13 and the rear cover 14 are in fitted assembly with each other to form a chamber having an opening, the front cover 11 is in fitted assembly with the chamber at the opening thereof, the upper cover 13 is covered with the lower cover 12 and then fixed with both the front cover 11 and the rear cover 14 through screws; the power board 40 is fixed to the lower cover 12 in a slot assembly manner; the front cover 11 has multiple windows for respectively accommodating the connection port unit 30 and the radiator 34; the front cover 11 is fixed with both the upper cover 13 and the lower cover 12 through screws; the upper cover 13 has multiple windows for respectively accommodating the camera module data interface unit 20, the power switch 35 and the indicator light 36. Various ports of the connection port unit 30 are uniformly set on the front cover 11 for easy to be managed and used together. Similarly, both the camera module data interface unit 20 and the power switch 35 are set to the upper cover 13 for not only being easily managed and used together, but reducing a volume of the detection device. In the detection device for the mobile phone camera module according to the preferred embodiment of the present invention, the FBGA chip 51 and the FX3 chip 52 are set on the main board 50 for achieving that the data transmission speed reaches 1.5 Gbps; the camera module data interface unit 20 comprises the two female headers 21 with the 40 pins, that is to say, that the two female headers 21 are two interfaces of the camera module data interface unit 20, and is able to support the detection of the double camera modules. The detection device for the mobile phone camera module provided by the present invention provides five sets of sensor programmable power supplies with high precision and low noise, is able to support the sensor current detection technology and the sensor open short circuit detection.

The above description is only the preferred embodiment of the present invention and is not intended to limit the present invention. Any modification, equivalent replacement, or improvement made within the spirit and principle of the present invention should be included in the protection scope of the present invention.

What is claimed is:

1. A detection device for a mobile phone camera module, which comprises a casing (10), a power board (40), a main board (50), a camera module data interface unit (20), a connection port unit (30) and an adapter plate (70), wherein:

both the power board (40) and the main board (50) are disposed within the casing (10); the power board (40) is respectively electrically connected with the camera module data interface unit (20) and the connection port unit (30); the casing (10) has multiple windows for respectively accommodating the camera module data interface unit (20) and the connection port unit (30); a radiator (34), a power switch (35) and an indicator light (36) are disposed within the casing (10), and are electrically connected with both the main board (50) and the power board (40);

the casing (10) is a cuboid and comprises a front cover (11), a lower cover (12), an upper cover (13) and a rear cover (14); the lower cover (12), the upper cover (13) and the rear cover (14) are in fitted assembly with each other to form a chamber having an opening, the front cover (11) is in fitted assembly with the chamber at the opening thereof; the front cover (11) has multiple windows for respectively accommodating the connection port unit (30) and the radiator (34); the upper cover (13) has multiple windows for respectively accommodating the camera module data interface unit (20), the power switch (35) and the indicator light (36);

the connection port unit (30) comprises an expansion port (31), a power port (32) and a USB (universal serial bus) 3.0 port (33);

the adapter plate (70) is fixed to the power board (40) through copper columns, all of the power port (32), the USB3.0 port (33), the indicator light (36) and the power switch (35) are welded to the adapter plate (70);

the camera module data interface unit (20) comprises two female headers for respectively defining two interfaces of the camera module data interface unit (20), and each of the two female headers has 40 pins;

an FBGA (Fine-Pitch Ball Grid Array) chip (51) and an FX3 chip (52) are disposed on the main board (50).

\* \* \* \* \*